United States Patent
Orita

(10) Patent No.: US 9,882,117 B2
(45) Date of Patent: Jan. 30, 2018

(54) ACTUATOR INCLUDING A DIELECTRIC ELASTOMER AND ELECTRODE FILMS

(71) Applicant: HONDA MOTOR CO., LTD., Tokyo (JP)

(72) Inventor: Atsuo Orita, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 336 days.

(21) Appl. No.: 14/724,256

(22) Filed: May 28, 2015

(65) Prior Publication Data

US 2016/0352254 A1    Dec. 1, 2016

(51) Int. Cl.
  *H01L 41/09*   (2006.01)
  *H01L 41/047*  (2006.01)
  *H01L 41/08*   (2006.01)

(52) U.S. Cl.
  CPC ........ *H01L 41/0986* (2013.01); *H01L 41/047* (2013.01)

(58) Field of Classification Search
  CPC ............... H01L 41/0986; H01L 41/047; H01L 41/0472; H01L 41/09; H02N 11/00
  USPC .......................................................... 310/309
  See application file for complete search history.

(56) References Cited

U.S. PATENT DOCUMENTS

| | | | | |
|---|---|---|---|---|
| 6,376,971 B1 * | 4/2002 | Pelrine | .................... | F04B 35/00 310/363 |
| 7,732,999 B2 * | 6/2010 | Clausen | ................ | H01L 41/083 310/328 |
| 7,880,371 B2 * | 2/2011 | Benslimane | .......... | H01L 41/083 310/367 |
| 8,188,636 B2 * | 5/2012 | Baird | ....................... | H03K 3/45 310/319 |
| 8,316,526 B2 * | 11/2012 | Pei | ...................... | H01L 41/0536 29/592.1 |
| 9,199,458 B2 * | 12/2015 | Kondo | ................ | H01L 41/0472 |
| 9,321,263 B2 * | 4/2016 | Masuda | ............... | B41J 2/14201 |

(Continued)

FOREIGN PATENT DOCUMENTS

| | | | | |
|---|---|---|---|---|
| JP | 2003-174205 | | 6/2003 | |
| JP | 2009-021328 | | 1/2009 | |
| JP | 2016226258 A | * | 12/2016 | ........... H01L 41/047 |

OTHER PUBLICATIONS

Kofod, G.; Sommer-Larsen, P.: Finite-Elasticity Models of Actuation. In: Dielectric Elastomers as Electrochemical Transducers. Edited by CARPI F. [etal], 2008, pp. 159-168—ISBN 978-0-08-047488-5 (English text).

(Continued)

*Primary Examiner* — Edgardo San Martin
(74) *Attorney, Agent, or Firm* — Rankin, Hill & Clark LLP

(57) ABSTRACT

An actuator capable of preventing occurrence of insulation breakdown while achieving an appropriate operation performance of a dielectric elastomer is provided. Electrode films to be bonded to a dielectric elastomer are formed such that a characteristic of a change in thickness d of the elastomer with an increase in an applied voltage of the elastomer shows a first voltage range in which a decline rate of to the increase in is high and a second voltage range, including a voltage higher than the first voltage range, in which the decline rate of d to the increase in is low, and a voltage value at which the insulation breakdown of the elastomer occurs falls within the second voltage range.

4 Claims, 2 Drawing Sheets

(56) References Cited

U.S. PATENT DOCUMENTS

| | | | | |
|---|---|---|---|---|
| 9,627,996 | B1* | 4/2017 | Orita | H02N 2/062 |
| 2014/0145550 | A1* | 5/2014 | Hitchcock | H01L 41/113 |
| | | | | 310/300 |
| 2015/0022055 | A1* | 1/2015 | Somitsch | H01L 41/0472 |
| | | | | 310/311 |
| 2015/0349240 | A1* | 12/2015 | Mizukami | H01L 41/1876 |
| | | | | 347/70 |
| 2016/0020026 | A1* | 1/2016 | Lazarev | H01G 4/30 |
| | | | | 361/301.4 |
| 2016/0351784 | A1* | 12/2016 | Cutkosky | H01L 41/047 |

OTHER PUBLICATIONS

Bozlar, Michael (etal): Dielectric elastomer actuators with elastomeric electrodes. In Appl. Phys. Lett. 101, 091907 (2012)—doi: 10.1063/1.478114 (English text).

German Office Action dated Jan. 31, 2017 (English translation included).

German Search Report dated Jan. 30, 2017 (English translation included).

* cited by examiner

ACTUATOR INCLUDING A DIELECTRIC ELASTOMER AND ELECTRODE FILMS

BACKGROUND OF THE INVENTION

Field of Invention

The present invention relates to an actuator including a dielectric elastomer.

Description of the Related Art

In recent years, development of an actuator including a dielectric elastomer in a form of a film and electrode films bonded to both surfaces of the dielectric elastomer in a thickness direction thereof has been promoted (e.g. Japanese Patent Laid-Open No. 2009-21328 and Japanese Patent Laid-Open No. 2003-174205).

In this kind of the actuator, in the case that a voltage is applied to the dielectric elastomer through the electrode film, the dielectric elastomer is compressed in the thickness direction by Maxwell stress, and the dielectric elastomer is expanded in a direction along a surface (a direction orthogonal to the thickness direction).

Then, a thickness of the dielectric elastomer is changed by changing a voltage applied to the electric elastomer, and the electric elastomer can be expanded and contracted in the direction along the surface consequently.

In a conventional actuator shown in Japanese Patent Laid-Open No. 2009-21328 and Japanese Patent Laid-Open No. 2003-174205, in order to excellently expand and contact the dielectric elastomer in the direction along the surface, the electrode films to be bonded to both surfaces of the dielectric elastomer in the thickness direction are turned to expandable and contractable soft ones (that is, the ones with low stiffness).

However, in the actuator using such electrode films with low stiffness, the following inconvenience tends to occur.

That is, in the electric elastomer, since the Maxwell stress generated by application of a voltage becomes a size inversely proportional to a square of the thickness of the dielectric elastomer, when the thickness of the dielectric elastomer becomes thin to some extent, compression force of the dielectric elastomer diverges and increases accompanying the increase of the applied voltage, and thus the thickness of the dielectric elastomer suddenly declines. Consequently, even though the stiffness of the dielectric elastomer increases by compression, the thickness easily declines to the thickness to cause insulation breakdown of the dielectric elastomer by slight fluctuation of the applied voltage.

In particular, as seen in Japanese Patent Laid-Open No. 2003-174205, in the one to keep the dielectric elastomer in an initial state of not applying voltage in the state of being strained in the direction along the surface (a so-called pre-strain state), since the thickness of the dielectric elastomer in the initial state is relatively thin, decline of the thickness of the electric elastomer tends to drastically progress with slight increase of the applied voltage. Consequently, the insulation breakdown tends to occur.

On the other hand, in the case that the stiffness of the electrode film is increased for example in order to dissolve the inconvenience, the expansion and contraction of the dielectric elastomer in the direction along the surface is constrained by the electrode film Therefore, elastic deformation of the dielectric elastomer due to application of the voltage is obstructed. Consequently, a variable width of the dielectric elastomer in the thickness direction, or the variable width of a length in the direction along the surface becomes small, and it becomes difficult to secure a required performance of the actuator.

SUMMARY OF THE INVENTION

The present invention is implemented in consideration of such a background, and it is an object to provide an actuator capable of preventing occurrence of insulation breakdown while achieving an appropriate operation performance of a dielectric elastomer.

An actuator of the present invention includes, in order to achieve the object, a dielectric elastomer in a form of a film, and electrode films bonded respectively to both surfaces of the dielectric elastomer in a thickness direction thereof, wherein a thickness of the dielectric elastomer is changed with a change in voltage applied to the dielectric elastomer through the electrode films, and the electrode films are formed to satisfy a first condition where a characteristic of a change in thickness of the dielectric elastomer with an increase in elastomer applied voltage, which is the voltage applied to the dielectric elastomer, shows a first voltage range in which a decline rate of the thickness to the increase in the elastomer applied voltage is relatively high and a second voltage range, including a voltage higher than the first voltage range, in which the decline rate of the thickness to the increase in the elastomer applied voltage is relatively lower than that of the first voltage range, and a second condition where an elastomer applied voltage value at which insulation breakdown of the dielectric elastomer occurs falls within the second voltage range (first invention).

In the present invention, the decline rate of the thickness to the increase in the elastomer applied voltage is a decline amount of the thickness per unit increase amount of the elastomer applied voltage.

Here, according to various kinds of experiments and examinations by the inventor of the present application, by appropriately setting a configuration related to the stiffness of the electric elastomer, the characteristic of the change in the thickness of the dielectric elastomer with the increase in the elastomer applied voltage can be turned to the characteristic capable of satisfying the first and second conditions.

By forming the electrode films so as to satisfy the first and second conditions in this way, the elastomer applied voltage value at which the insulation breakdown of the dielectric elastomer occurs (sometimes called an insulation breakdown occurrence voltage, hereinafter) can be a voltage sufficiently higher than a voltage value in the first voltage range in which the decline rate is relatively high.

Also, in a voltage range that is equal to or below the insulation breakdown occurrence voltage and is around the insulation breakdown occurrence voltage, the thickness of the dielectric elastomer hardly declines to the increase in the elastomer applied voltage.

Further, in the first voltage range which is the voltage range lower than the voltage range around the insulation breakdown occurrence voltage, the thickness of the dielectric elastomer can be changed with excellent sensitivity to the change in the elastomer applied voltage.

Thus, according to the first invention, occurrence of the insulation breakdown of the dielectric elastomer can be prevented while achieving the appropriate operation performance of the dielectric elastomer.

In the first invention, the characteristic of the change in the thickness of the dielectric elastomer with the increase in the elastomer applied voltage is closely related to the stiffness of the electrode film, in particular. Then, the stiffness of the electrode film generally corresponds to a material, thickness or shape of the electrode film.

Accordingly, in the first invention, a mode of setting the stiffness, material, thickness, or shape of the electrode film can be adopted so that the characteristic of the change in the thickness of the dielectric elastomer with the increase in the elastomer applied voltage satisfies the first and second conditions (second invention).

Thus, it is possible to appropriately achieve formation of the electrode film so that the characteristic of the change in the thickness of the dielectric elastomer with the increase in the elastomer applied voltage satisfies the first and second conditions.

In the first invention or the second invention, it is preferable that the electrode films are formed so as to further satisfy a third condition where a difference between the voltage value at which the insulation breakdown of the dielectric elastomer occurs and a required upper limit of the elastomer applied voltage is greater than a predetermined voltage range (third invention).

Accordingly, even when the voltage actually applied to the dielectric elastomer becomes higher than the required upper limit (a required value of an upper limit of the elastomer applied voltage) due to a control error of the elastomer applied voltage or the like, occurrence of the insulation breakdown of the dielectric elastomer is prevented until the actually applied voltage reaches a voltage value for which the predetermined voltage range is added to the required upper limit.

Then, in this case, since the insulation breakdown occurrence voltage falls within the second voltage range, the predetermined voltage range can be set at a relatively wide voltage range.

Therefore, according to the third invention, reliability of preventing occurrence of the insulation breakdown of the dielectric elastomer can be improved.

In the third invention, the required upper limit of the elastomer applied voltage can be set at the elastomer applied voltage value corresponding to a required lower limit of a variable range of the thickness of the dielectric elastomer in a requirements specification of the actuator, for example (fourth invention).

Accordingly, in the case that the actuator is operated so as to change the actual thickness of the dielectric elastomer in the variable range of the thickness of the dielectric elastomer in the requirements specification of the actuator, even when the actually applied voltage of the dielectric elastomer varies, the insulation breakdown of the dielectric elastomer can be prevented with high reliability. Therefore, the reliability of the operation of the actuator in the requirements specification can be improved.

In the fourth invention, it is preferable that the electrode films are formed so as to further satisfy a fourth condition where the elastomer applied voltage value corresponding to the required lower limit of the variable range of the thickness of the dielectric elastomer falls within the first voltage range (fifth invention).

Accordingly, in the case that the actuator is operated so as to change the actual thickness of the dielectric elastomer in the variable range of the thickness of the dielectric elastomer, the thickness of the dielectric elastomer can be changed with excellent sensitivity to the change in the elastomer applied voltage.

Also, since the predetermined voltage range can be set at the wide voltage range, even when the actually applied voltage of the dielectric elastomer varies, the reliability of preventing the insulation breakdown of the dielectric elastomer can be effectively improved further.

In the first-fourth inventions, the electrode films can be formed such that the characteristic of the change in the thickness of the dielectric elastomer with the increase in the elastomer applied voltage shows the first and second voltage ranges, in which a deviation (D1−D2) of the decline rate D1 in the first voltage range and the decline rate D2 in the second voltage range, or a ratio (D1/D2) of D1 to D2 is equal to or greater than a predetermined value (sixth invention).

Accordingly, the electrode films can be formed such that the decline rate D1 in the first voltage range and the decline rate D2 in the second voltage range shown by the characteristic of the change in the thickness of the dielectric elastomer with the increase in the elastomer applied voltage are sufficiently different from each other.

Therefore, when providing the actuator capable of changing the thickness of the dielectric elastomer with excellent sensitivity to the change in the elastomer applied voltage while preventing the insulation breakdown of the dielectric elastomer, a suitable characteristic (the characteristic of the change in the thickness of the dielectric elastomer with the increase in the elastomer applied voltage) can be achieved.

DETAILED DESCRIPTION OF THE PREFERRED EMBODIMENT

One embodiment of the present invention will be described below with reference to FIGS. 1 to 3.

Figure 1:
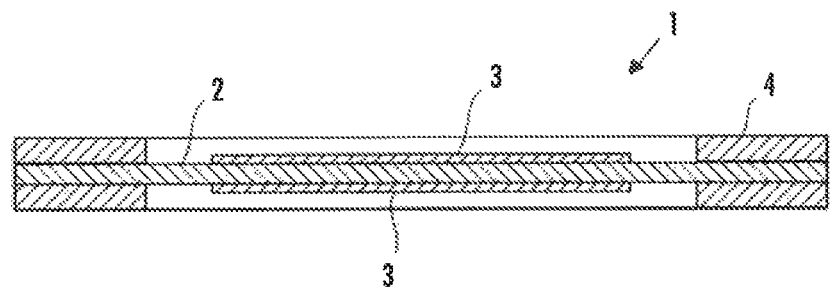
FIG. 1 is a cross-sectional view illustrating a main configuration of an actuator in one embodiment of the present invention.

Referring to FIG. 1, an actuator 1 of the present embodiment includes a dielectric elastomer 2 in a form of a film, and electrode films 3 bonded to both surfaces of the dielectric elastomer 2 in a thickness direction thereof.

The dielectric elastomer 2 is an elastomer having a dielectric property. The dielectric elastomer 2 has a property to be contracted in the thickness direction of the dielectric elastomer 2 (consequently, to be expanded in a direction along a surface (a direction orthogonal to the thickness direction) of the dielectric elastomer 2), when a voltage is applied (an electric field is made to act) through the electrode films 3 in the thickness direction, by Maxwell stress generated accordingly. The dielectric elastomer 2 can be formed of, for example, a silicone resin, a urethane resin, an acrylic resin, or the like.

In the present embodiment, a frame body 4 is attached to a peripheral edge of the dielectric elastomer 2. In this case, the peripheral edge of the dielectric elastomer 2 is held by the frame body 4 in the state of straining the dielectric elastomer 2 in the direction along the surface. Therefore, the dielectric elastomer 2 on an inner side of the frame body 4 is in a pre-strain state that tensile force in the direction along the surface is imparted beforehand.

Therefore, in the actuator 1 of the present embodiment, the dielectric elastomer 2 bends on the inner side of the frame body 4 (for example, bends so that the center of the dielectric elastomer 2 is projected in a normal direction), when the voltage is applied in the thickness direction.

The electrode film 3 is formed to have a conductive property and also have a required characteristic. More specifically, the electrode film 3 is configured, in addition to having the conductive property, so as to satisfy at least a first condition where a characteristic of a change in thickness d of the dielectric elastomer 2 with an increase in a voltage V (called an elastomer applied voltage V, hereinafter) applied to the dielectric elastomer 2 through the electrode films 3 shows a first voltage range in which a decline rate of the thickness d to the increase in the elastomer applied voltage V is relatively high and a second voltage range in which the decline rate of the thickness d to the increase in the voltage V is relatively lower than that of the first voltage range, and a second condition where a voltage value Vmax at which insulation breakdown of the dielectric elastomer 2 occurs falls within the second voltage range. The decline rate is a decline amount of the thickness d per unit increase amount of the elastomer applied voltage V.

Further, in the present embodiment, the electrode films 3 are formed so as to satisfy a third condition where a difference (=Vmax−Va) between the voltage value Vmax at which the insulation breakdown occurs and a required upper limit Va which is a required value of an upper limit of the elastomer applied voltage V is greater than a predetermined voltage range $\Delta$Vmg, and a fourth condition where the required upper limit Va falls within the first voltage range.

Here, the required upper limit Va of the elastomer applied voltage V is set beforehand in design related to a specification of the actuator 1. In the present embodiment, the value of the elastomer applied voltage V corresponding to a required lower limit of a variable range of the thickness d of the dielectric elastomer 2 in a requirements specification (target specification in design) of the actuator 1 (the value of the elastomer applied voltage V needed to match the thickness d with the required lower limit) is set as the required upper limit Va.

The first-fourth conditions can be achieved by appropriately setting stiffness of the electrode film 3, which is defined according to a material, thickness, shape or the like of the electrode film 3.

Here, a relation between the elastomer applied voltage V and the thickness d of the dielectric elastomer 2 will be described.

Figure 2:
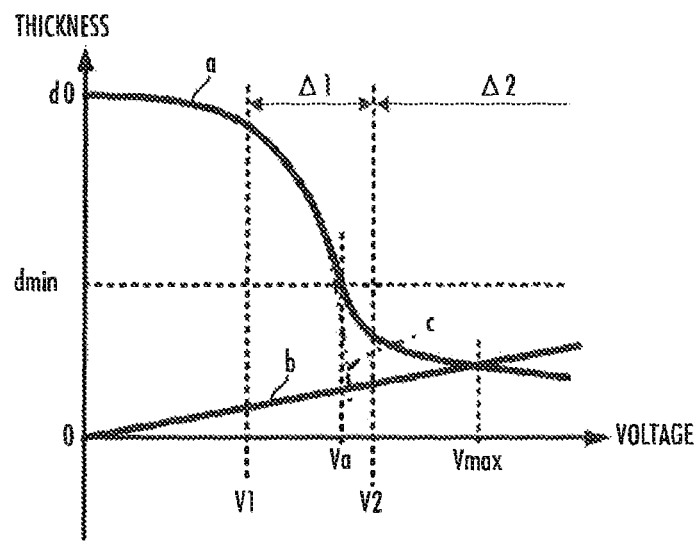
FIG. 2 is a diagram illustrating an operation characteristic of the actuator in the embodiment.

If the electrode film 3 bonded to the dielectric elastomer 2 is sufficiently low in stiffness (if the electrode film 3 can be freely expanded following expansion in the direction along the surface of the dielectric elastomer 2), when the elastomer applied voltage V is increased from zero, generally, the thickness d monotonously declines from initial thickness d0 (the thickness at V=0) of the dielectric elastomer 2 as illustrated by a graph c of a two-dot chain line in FIG. 2. In FIG. 2, the graph c overlaps with a graph a of a solid line at a left part.

In this case, in the graph c, the thickness d declines in such a form that the decline rate of d to the increase in V drastically gets high from the relatively low decline rate.

Therefore, in the state that the elastomer applied voltage V reaches a voltage value (Va illustrated in FIG. 2, for example) at which the decline rate of the thickness d becomes high, the thickness d drastically declines to the thickness at which the insulation breakdown of the dielectric elastomer 2 occurs (the thickness at an intersection of the graph c of the two-dot chain line and a graph b of a solid line) with just a little increase in the elastomer applied voltage V.

The graph b is a graph that approximates a relation between the thickness d of the dielectric elastomer 2 and the voltage at which the insulation breakdown occurs (called an insulation breakdown occurrence voltage, hereinafter) with a straight line. The insulation breakdown occurrence voltage becomes higher as the thickness d is greater.

On the other hand, when the stiffness of the electrode film 3 is increased to some extent, the characteristic of the change in the thickness d to the increase in the elastomer applied voltage V becomes the characteristic illustrated by the graph a of the solid line in FIG. 2, for example. In this case, when the elastomer applied voltage V is increased further from the state of reaching the voltage value (for example, Va illustrated in FIG. 2) at which the decline rate of the thickness d becomes high, the decline rate of d to the increase in V is lowered to the low rate. That is, d hardly declines to the increase in V.

It is assumed that this is because further decline of the thickness d of the dielectric elastomer 2 (further expansion in the direction along the surface) is suppressed since stress that the electrode film 3 is to return to an original size becomes relatively large when the electrode film expands in the direction along the surface of the dielectric elastomer 2 to some extent with the decline in the thickness d of the dielectric elastomer 2.

In this case, a value of d around the change from a state that the decline rate of d to the increase in V is extremely high to a state that it is low becomes larger (becomes closer to d0) as the stiffness of the electrode film 3 is higher. Also, the value of the elastomer applied voltage V corresponding to the value of d around the change from the state that the decline rate of d to the increase in V is extremely high to the state that it is low becomes slightly larger as the stiffness of the electrode film 3 is higher.

Therefore, by appropriately setting the stiffness of the electrode film 3, the characteristic of the change in the thickness d to the increase in the elastomer applied voltage V can satisfy the first and second conditions and the third and fourth conditions further.

Accordingly, in the present embodiment, by appropriately setting the stiffness of the electrode film 3, the characteristic of the change in the thickness d to the increase in the elastomer applied voltage V becomes the characteristic illustrated by the graph a in FIG. 2.

In the characteristic of the graph a in FIG. 2, for example, a voltage range $\Delta$1 (a range to be V1≤V≤V2) and a voltage range $\Delta$2 (a range to be V>V2) in the figure can be considered as the first voltage range and the second voltage range related to the first condition, respectively. In this case, compared to the decline rate of d at an arbitrary voltage value within the first voltage range $\Delta$1, the decline rate of d at an arbitrary voltage value within the second voltage range $\Delta$2 is relatively low. Therefore, the first condition is satisfied.

Also, in the characteristic of the graph a, the voltage value Vmax at an intersection of the graph a and the graph b related to the insulation breakdown occurrence voltage is the insulation breakdown occurrence voltage on the characteristic of the graph a. The insulation breakdown occurrence voltage Vmax falls into the second voltage range $\Delta$2 in which the decline rate of d to the increase in V is relatively low. Therefore, the second condition is satisfied.

Also, the variable range of the thickness d of the dielectric elastomer 2 in the requirements specification of the actuator 1 is set beforehand at a range from the thickness d0 at V=0 to dmin in FIG. 2 (a range to be d0≤d≤dmin) for example. In this case, dmin is the required lower limit of the variable range. Also, the voltage value Va corresponding to the required lower limit dmin in the characteristic of the graph a is the required upper limit Va of the elastomer applied voltage V.

Then, the stiffness of the electrode film 3 (consequently, the shape of the graph a) is set such that the difference (=Vmax−Va) between the insulation breakdown occurrence voltage Vmax and the required upper limit Va of the elastomer applied voltage V becomes greater than the predetermined voltage range ΔVmg (so as to be Vmax−Va>ΔVmg). Therefore, the third condition is satisfied.

In this case, the voltage range ΔVmg is a margin width set beforehand in consideration of control accuracy (variation) of the elastomer applied voltage V by a power supply not shown in the figure or the like. The voltage range ΔVmg is set such that the insulation breakdown of the dielectric elastomer 2 does not occur even when the voltage actually applied to the dielectric elastomer 2 increases from the required upper limit Va by ΔVmg.

Also, the stiffness of the electrode film 3 (consequently, the shape of the graph a) is set so that the required upper limit of the elastomer applied voltage V corresponding to the required lower limit dmin of the variable range of the thickness d falls within the first voltage range Δ1. Therefore, the fourth condition is satisfied.

In addition, in the description above, the first voltage range Δ1 and the second voltage range Δ2 are illustrated as the ranges that are continuous to each other. However, the first voltage range Δ1 and the second voltage range Δ2 may not be continuous to each other. For example, a range from which a part on an upper limit side of Δ1 is removed, that is illustrated in FIG. 2 (a range where a voltage value slightly smaller than V2 (a voltage value between Va and V2, for example) is an upper limit) may be considered as the first voltage range. Or, a range from which a part on a lower limit side of Δ2 is removed, that is illustrated in FIG. 2 (a range where a voltage value slightly larger than V2 (a voltage value between V2 and Vmax) is a lower limit) may be considered as the second voltage range.

In the present embodiment, the stiffness of the electrode film 3 is set so as to satisfy the first-fourth conditions as described above. In this case, the stiffness is set through selection or adjustment of a parameter that defines the stiffness. For example, by appropriately setting the material of the electrode film 3, adjusting the thickness of the electrode film 3, or setting the shape of the electrode film 3, the stiffness of the electrode film 3 can be set so as to satisfy the first-fourth conditions.

The electrode film 3 can be formed of a conductive nanotube constituted of carbon, or silicone or the like, for example. Also, the electrode film 3 is bonded to the dielectric elastomer 2 by an appropriate method. As the method, for example, a film forming technology of screen printing or the like can be adopted.

Next, one example of a method of setting the stiffness of the electrode film 3 will be described. The stiffness of the electrode film 3 not only can be set in a trial-and-error manner based on experiments or the like but also can be set on the basis of the method described below. The method described below is a method of calculating a value of a parameter that represents the stiffness of the electrode film 3 so as to approximately satisfy the first-fourth conditions.

The relation between the applied voltage V and the thickness d of the dielectric elastomer 2 can be expressed approximately by the following expression (1).

$$(d-d0)/d0 = (1/Ed) \cdot (-\epsilon r \cdot \epsilon 0 \cdot (V/d)^2 + k \cdot (d/d0)^\alpha) \quad (1)$$

Here, Ed denotes Young's modulus of the dielectric elastomer 2, ∈r denotes a dielectric constant of the dielectric elastomer 2, ∈0 denotes a dielectric constant of vacuum, k denotes the parameter expressing the stiffness of the electrode film 3 (in detail, the parameter defined according to Young's modulus and the thickness of the electrode film 3), and α denotes a constant value (≥1) that is set beforehand. Also, d0 denotes, as described above, the value of the thickness d at V=0 (in the state that the voltage is not applied to the dielectric elastomer 2).

A first term on the right side of this expression (1) corresponds to strain (compression strain) in the thickness direction of the dielectric elastomer 2 by the Maxwell stress, and a second term on the right side corresponds to strain generated in a direction of obstructing compression in the thickness direction of the dielectric elastomer 2 due to the stiffness of the electrode film 3.

From the expression (1), the following expression (2) is obtained.

$$V^2 = (Ed/(\epsilon r \cdot \epsilon 0)) \cdot (d^2 - (d^3/d0) + k' \cdot d0^\alpha \cdot d^{-\alpha+2}) \quad (2)$$

Provided that $k' \equiv k/(\epsilon r \cdot \epsilon 0)$ (2a)

Further, by differentiating both sides of the expression (2) by d, the following expression (3) is obtained.

$$2V \cdot (dV/dd) = (Ed/(\epsilon r \cdot \epsilon 0)) \cdot g(d) \quad (3)$$

Provided that, $$g(d) \equiv (2 \cdot d - 3 \cdot (d^2/d0) + k' \cdot d0^\alpha \cdot (-\alpha+2) \cdot d^{-\alpha+1}) \quad (3a)$$

In the expression (3a) above, g(d) defined therein denotes a function whose polarity coincides with a polarity of (dV/dd) denoting a gradient of V to d. Hereinafter, g(d) is called a gradient function g(d). The gradient function g(d) is a function illustrated by the graph in FIG. 3 (an upward-convex function to the increase in d (the function having a maximum value)). In FIG. 3, the graphs in the case of k=0, k=0.5, and k=1.0 are illustrated.

Here, when satisfying the first and second conditions, the value of the gradient function g(d) needs to be a negative value in the variable range of the thickness d from d0 to dmin (in other words, V monotonously declines with the increase in the value d from dmin to d0). Hereinafter, this condition is called a necessary condition A. The necessary condition A is, when described again, the condition of g(d)<0 in the variable range of the thickness d from d0 to dmin.

Figure 3:
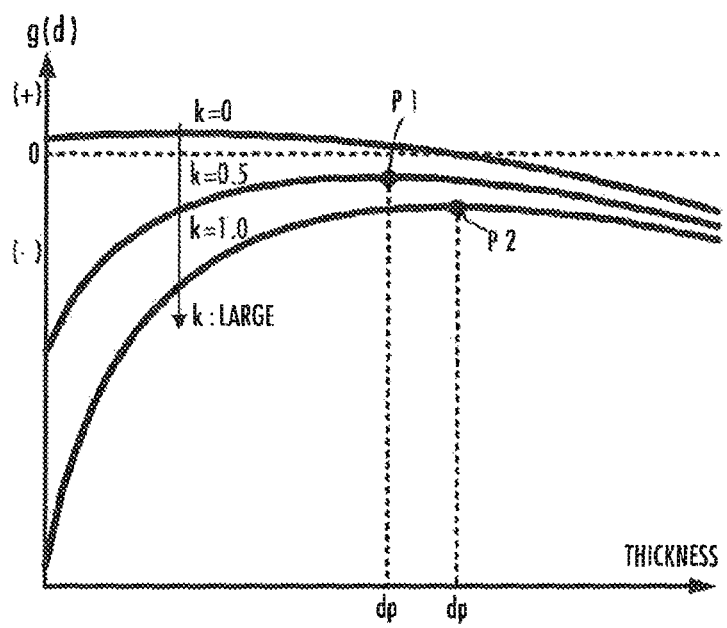
FIG. 3 is a diagram for illustrating a method of setting the operation characteristic of the actuator in the embodiment.

Also, in the gradient function g(d), the value of d to be g(d)≈0 is the value of d at which the value of g(d) becomes maximum or almost maximum (for example, the value of d at a point P1 or P2 indicated in FIG. 3), in other words, the value of d at which the gradient of V to d becomes maximum or almost maximum. It can be considered that the value of V having the relation of the expression (2) to the value of d (it is noted as dp, hereinafter) roughly coincides with the required upper limit Va of the elastomer applied voltage V corresponding to the required lower limit dmin in the graph a in the case that the required lower limit dmin of the variable range of d falls within the first voltage range Δ1.

Therefore, when satisfying the third and fourth conditions, a difference (=Vmax−Vp) between a voltage value Vp defined by the following expression (4) corresponding to the value dp of d to be g(d)≈0 and the insulation breakdown occurrence voltage Vmax calculated by the following expressions (5) and (6) as simultaneous equations (simultaneous equations with Vmax and dmax as unknown numbers)

needs to be larger than the predetermined voltage range $\Delta V_{mg}$. Hereinafter, this condition is called a necessary condition B.

The necessary condition B is, when described again, the condition that the difference ($=V_{max}-V_p$) between the voltage value $V_p$ defined by the expression (4) to the value $d_p$ of d to be $g(d) \approx 0$ and the value of the insulation breakdown occurrence voltage $V_{max}$ defined by the expressions (5) and (6) is larger than the predetermined voltage range $\Delta V_{mg}$ ($V_{max}-V_p > \Delta V_{mg}$).

$$Vp^2 = (Ed/(\in r \cdot \in 0)) \cdot (dp^2 - (dp^3/d0) + k' \cdot d0^\alpha \cdot dp^{-\alpha+2}) \quad (4)$$

$$V_{max} = Eb \cdot d_{max} \quad (5)$$

$$V_{max}^2 = (Ed/(\in r \cdot \in 0)) \cdot (d_{max}^2 - (d_{max}^3/d0) + k' \cdot d0^\alpha \cdot d_{max}^{-\alpha+2}) \quad (6)$$

Here, the right side of the expression (4) is the expression for which d on the right side of the expression (2) is replaced with $dp$, the expression (5) is the expression that defines a relation between the insulation breakdown occurrence voltage $V_{max}$ and the value $d_{max}$ of the thickness d corresponding to it (the expression indicating the graph b in FIG. 2), and the right side of the expression (6) is the expression for which d on the right side of the expression (2) is replaced with $d_{max}$. Also, Eb in the expression (5) is a proportionality constant that defines the relation between $V_{max}$ and $d_{max}$.

In one example of the method of setting the stiffness of the electrode film 3, after determining the material and shape of the electrode film 3 beforehand, the value of k' (consequently, the value of k) is determined so as to satisfy the necessary conditions A and B using the expressions (3a), (4), (5) and (6).

In this case, the lower limit of k' can be determined on the basis of the necessary condition A. Then, within a range of the value equal to or larger than the lower limit, the value of k' that satisfies the necessary condition B can be obtained by a well-known retrieval operation method for example. Further, from the value of k', the value of the parameter k expressing the stiffness of the electrode film 3 can be determined according to a definitional equation of the expression (2a).

Also, in this case, in the expression (4), the value $dp$ of d to be $g(d) \approx 0$ is calculated as a representative value of d to be $|g(d)| < \delta$ ($\delta$: a positive predetermined value near zero) for example. Also, as the value of Ed in the expressions (4) and (6) and the value of Eb in the expression (5), a set value (constant value) determined beforehand for example is usable. However, when improving the reliability of the value of k to be obtained more, the value of Young's modulus Ed for example may be calculated using a super-viscoelastic model such as an Ogden model.

Since the parameter k determined in this way corresponds to the material and thickness of the electrode film 3, from the value of the determined parameter k and the material selected beforehand of the electrode film 3, the thickness of the electrode film 3 can be determined.

By determining the value of the parameter k expressing the stiffness of the electrode film 3 as described above, the thickness of the electrode film 3 can be efficiently determined so as to obtain the stiffness of the electrode film 3 that can turn the characteristic of the change in the thickness d to the increase in the elastomer applied voltage V to the one capable of satisfying the first-fourth conditions.

According to the embodiment described above, since the electrode film 3 is formed so as to satisfy the first and second conditions, the insulation breakdown occurrence voltage $V_{max}$ of the dielectric elastomer 2 becomes a relatively high voltage, and the thickness d of the dielectric elastomer 2 hardly declines to the increase in the applied voltage V in the voltage range that is equal to or below the $V_{max}$ and is around the $V_{max}$.

Then, in the voltage range lower than the voltage range around $V_{max}$, the thickness d of the dielectric elastomer 2 can be changed with excellent sensitivity to the change in the applied voltage V.

Therefore, occurrence of the insulation breakdown of the dielectric elastomer 2 can be prevented while achieving the appropriate operation performance (the performance that the thickness d can be changed in a sufficient variable width) of the dielectric elastomer 2.

In particular, since a difference between the insulation breakdown occurrence voltage $V_{max}$ and the required upper limit Va of the elastomer applied voltage V corresponding to the required lower limit $d_{min}$ of the variable range of the thickness d of the dielectric elastomer 2 or the Vp ($\approx$Va) is greater than the predetermined voltage range $\Delta V_{mg}$, the reliability of preventing the occurrence of the insulation breakdown of the dielectric elastomer 2 can be improved.

Further, since the required upper limit Va of the elastomer applied voltage V corresponding to the required lower limit $d_{min}$ of the variable range of the thickness d of the dielectric elastomer 2 falls within the first voltage range $\Delta 1$ in which the decline rate of d to the increase in V becomes high, the thickness d of the dielectric elastomer 2 can be changed with excellent sensitivity to the change in the elastomer applied voltage V in a wide range within the variable range of the thickness d. Also, since the difference between the insulation breakdown occurrence voltage $V_{max}$ and the required upper limit Va of the elastomer applied voltage V can be made as big as possible, the reliability of preventing the occurrence of the insulation breakdown of the dielectric elastomer 2 can be effectively improved.

The present invention is not limited to the embodiment above, and various modes other than the embodiment can be adopted. Below, some modified modes of the embodiment will be described.

In the embodiment, the voltage value Va corresponding to the required lower limit $d_{min}$ of the variable range of the thickness d of the dielectric elastomer 2 is the required upper limit Va of the elastomer applied voltage V related to the third condition.

However, for example, in the case that the required upper limit of the elastomer applied voltage V generable by a power supply that generates the elastomer applied voltage is predetermined due to a specification of the power supply or the like, the required upper limit is also usable as the required upper limit Va of the elastomer applied voltage V related to the third condition.

Also, in the embodiment, the electrode film 3 is formed so as to satisfy the fourth condition that the required upper limit Va of the elastomer applied voltage V corresponding to the required lower limit $d_{min}$ of the variable range of the thickness d of the dielectric elastomer 2 falls within the first voltage range $\Delta 1$.

However, the required upper limit Va of the elastomer applied voltage V may be the value on the side of the voltage higher than the first voltage range $\Delta 1$ (for example, the value that falls within the second voltage range $\Delta 2$), in the range satisfying the third condition.

Also, in the case of forming the electrode film 3 so as to obtain the characteristic in the shape of the graph a, it is possible to form the electrode film 3 such that the characteristic of the change in the thickness d of the dielectric elastomer 2 with the increase in the elastomer applied voltage v shows the first voltage range Δ1 and the second voltage range Δ2 in which the deviation (D1−D2) of the decline rate D1 of the thickness d in the first voltage range Δ1 and the decline rate D2 of the thickness d in the second voltage range Δ2, or the ratio (D1/D2) of the D1 to D2 is equal to or greater than the predetermined value.

In this case, as the decline rate D1 of the thickness d in the first voltage range Δ1, an average value of the decline rate of the thickness d in the first voltage range Δ1 is usable for example. Or, a representative value of the decline rate of the thickness d in the first voltage range Δ1 (for example, the maximum value, minimum value or mean value of the decline rate) is also usable as the value of D1. It is similar for the decline rate D2 of the thickness d in the second voltage range Δ2.

When the electrode film 3 is formed in this way, the decline rate D1 of the thickness d in the first voltage range Δ1 and the decline rate D2 of the thickness d in the second voltage range Δ2 can be made sufficiently different.

Therefore, when providing the actuator 1 capable of changing the thickness d with excellent sensitivity to the change in the elastomer applied voltage V while preventing the insulation breakdown of the dielectric elastomer 2, the suitable characteristic (the characteristic of the change in the thickness d of the dielectric elastomer 2 with the increase in the elastomer applied voltage V) can be achieved.

Also, in the embodiment, the actuator 1 in which the dielectric elastomer 2 is in the pre-strain state that the tensile force in the direction along the surface is imparted beforehand is illustrated. However, the actuator of the present invention may be the actuator in the form that the tensile force in the direction along the surface of the dielectric elastomer is not imparted beforehand in the state that the applied voltage V is zero.

What is claimed is:

1. An actuator comprising:
   a dielectric elastomer in a form of a film; and
   electrode films bonded respectively to both surfaces of the dielectric elastomer in a thickness direction thereof,
   wherein a thickness of the dielectric elastomer is changed with a change in voltage applied to the dielectric elastomer through the electrode films, and
   the electrode films have stiffness to satisfy
   a first condition where a characteristic of a change in thickness of the dielectric elastomer with an increase in elastomer applied voltage, which is the voltage applied to the dielectric elastomer, shows
      a first voltage range in which a decline rate of the thickness of the dielectric elastomer to the increase in elastomer applied voltage is a first decline rate D1, and
      a second voltage range, including a voltage higher than the first voltage range, in which a decline rate of the thickness of the dielectric elastomer to the increase in elastomer applied voltage is a second decline rate D2 which is less than that of the first decline rate D1, and
   a second condition where an elastomer applied voltage value at which insulation breakdown of the dielectric elastomer occurs falls within the second voltage range,
   wherein the electrode films have stiffness such that the characteristic of the change in thickness of the dielectric elastomer with the increase in elastomer applied voltage shows the first and second voltage ranges, the first and second voltage ranges being set such that a deviation D1-D2 or a ratio D1/D2 is set at equal to or greater than a predetermined value.

2. The actuator of claim 1, wherein
the electrode films have stiffness so as to further satisfy a third condition where a difference between the voltage value at which the insulation breakdown of the dielectric elastomer occurs and a required upper limit of the elastomer applied voltage is greater than a predetermined voltage range.

3. The actuator of claim 2, wherein
the required upper limit of the elastomer applied voltage is set at an elastomer applied voltage value corresponding to a required lower limit of a variable range of the thickness of the dielectric elastomer in a requirements specification of the actuator.

4. The actuator of claim 3, wherein
the electrode films have stiffness so as to further satisfy a fourth condition where the elastomer applied voltage value corresponding to the required lower limit of the variable range of the thickness of the dielectric elastomer falls within the first voltage range.

* * * * *